US011018235B2

(12) United States Patent
Huynh Bao et al.

(10) Patent No.: US 11,018,235 B2
(45) Date of Patent: May 25, 2021

(54) VERTICALLY STACKED SEMICONDUCTOR DEVICES HAVING VERTICAL CHANNEL TRANSISTORS

(71) Applicants: IMEC VZW, Leuven (BE); Vrije Universiteit Brussel, Brussels (BE)

(72) Inventors: Trong Huynh Bao, Elsene (BE); Anabela Veloso, Leuven (BE); Julien Ryckaert, Tervuren (BE)

(73) Assignees: IMEC vzw, Leuven (BE); Vrije Universiteit Brussel, Brussels (BE)

( * ) Notice: Subject to any disclaimer, the term of this patent is extended or adjusted under 35 U.S.C. 154(b) by 0 days.

(21) Appl. No.: 15/349,904

(22) Filed: Nov. 11, 2016

(65) Prior Publication Data
US 2017/0358586 A1 Dec. 14, 2017

(30) Foreign Application Priority Data

Jun. 13, 2016 (EP) .................................... 16174252

(51) Int. Cl.
*H01L 29/423* (2006.01)
*H01L 23/528* (2006.01)
*H01L 29/06* (2006.01)
*H01L 29/786* (2006.01)
*H01L 27/11* (2006.01)
*H01L 29/775* (2006.01)
*H01L 29/66* (2006.01)
*B82Y 10/00* (2011.01)
*H01L 27/06* (2006.01)
*H01L 29/417* (2006.01)

(52) U.S. Cl.
CPC ........ *H01L 29/42392* (2013.01); *B82Y 10/00* (2013.01); *H01L 27/0688* (2013.01); *H01L 27/1104* (2013.01); *H01L 29/0676* (2013.01); *H01L 29/66439* (2013.01); *H01L 29/66666* (2013.01); *H01L 29/775* (2013.01); *H01L 29/7869* (2013.01); *H01L 29/78642* (2013.01); *H01L 29/41733* (2013.01)

(58) Field of Classification Search
CPC ........... H01L 27/1108; H01L 29/41733; H01L 29/42392; H01L 29/0676
See application file for complete search history.

(56) References Cited

U.S. PATENT DOCUMENTS

| 4,918,510 A | * | 4/1990 | Pfiester ................. H01L 27/092 257/398 |
|---|---|---|---|
| 2001/0002715 A1 | | 6/2001 | Armacost et al. |
| 2003/0136978 A1 | | 7/2003 | Takaura et al. |

(Continued)

*Primary Examiner* — Dale E Page
*Assistant Examiner* — Wilner Jean Baptiste
(74) *Attorney, Agent, or Firm* — Knobbe, Martens, Olson & Bear, LLP

(57) ABSTRACT

The disclosed technology generally relates to semiconductor devices, and more particularly to semiconductor devices having a stacked arrangement, and further relates to methods of fabricating such devices. In one aspect, a semiconductor device comprises a first memory device and a second memory device formed over a substrate and at least partly stacked in a vertical direction. Each of the first and second memory devices has a plurality of vertical transistors, wherein each vertical transistor has a vertical channel extending in the vertical direction.

19 Claims, 12 Drawing Sheets

(56) References Cited

U.S. PATENT DOCUMENTS

| | | | |
|---|---|---|---|
| 2005/0280061 A1* | 12/2005 | Lee | H01L 24/83 257/296 |
| 2008/0291767 A1 | 11/2008 | Barnes et al. | |
| 2011/0018056 A1* | 1/2011 | Takeuchi | H01L 21/76895 257/329 |
| 2013/0141963 A1* | 6/2013 | Liaw | G11C 11/412 365/156 |
| 2014/0070320 A1* | 3/2014 | Mukherjee | H01L 21/82345 257/368 |
| 2015/0069384 A1* | 3/2015 | Kobayashi | H01L 29/7869 257/43 |
| 2015/0162074 A1 | 6/2015 | Lin et al. | |
| 2015/0303270 A1* | 10/2015 | Liaw | H01L 29/42392 257/9 |

* cited by examiner

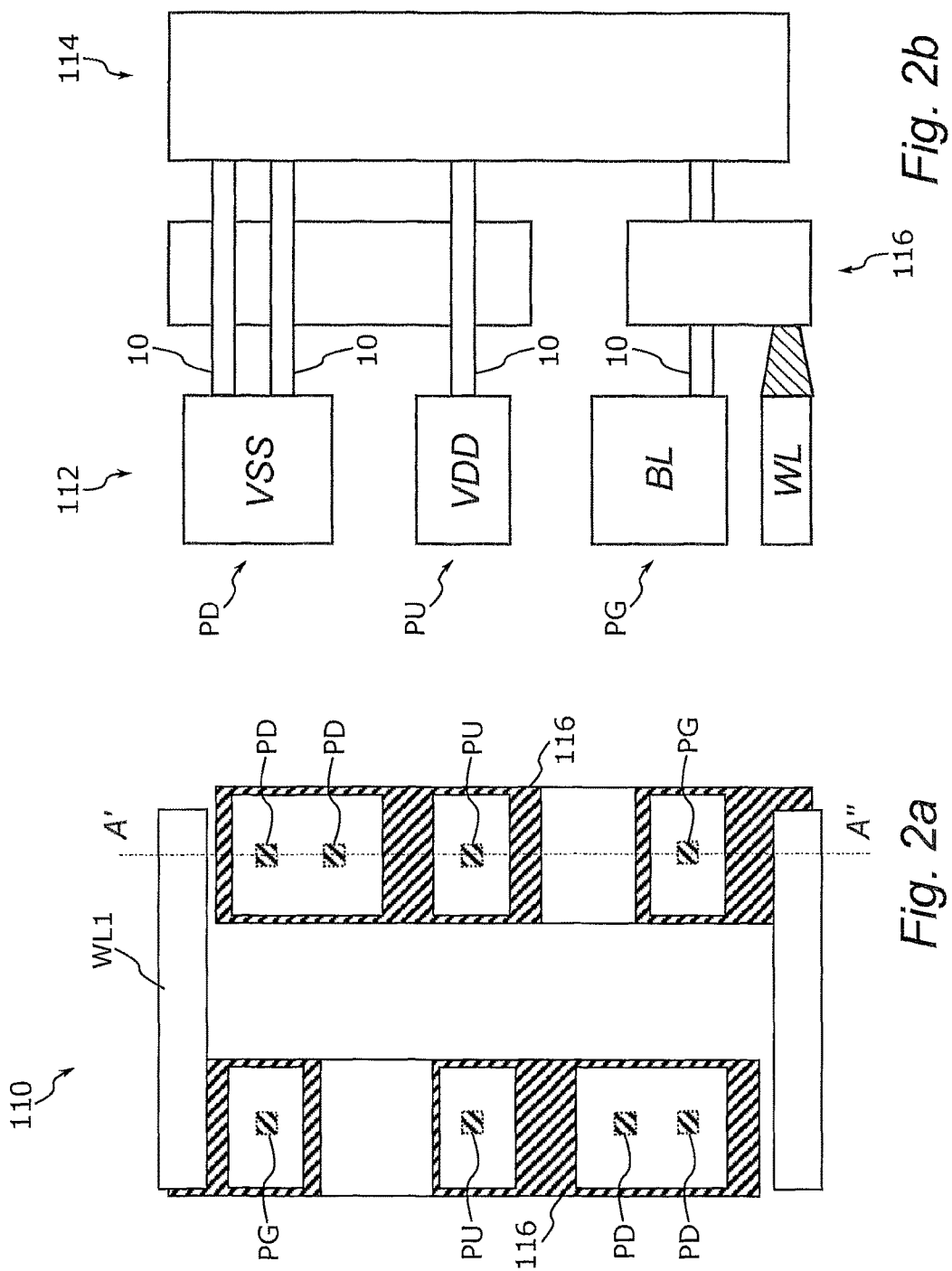

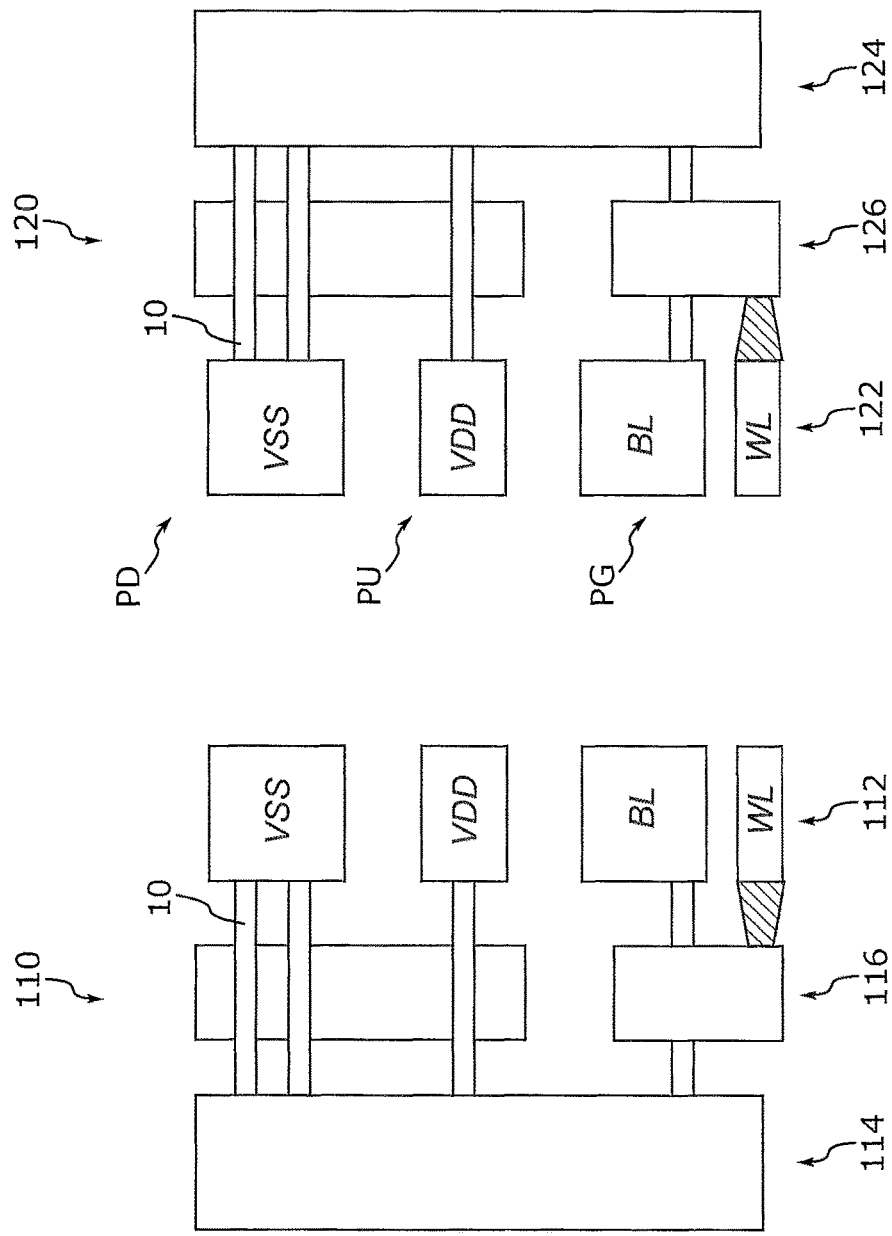

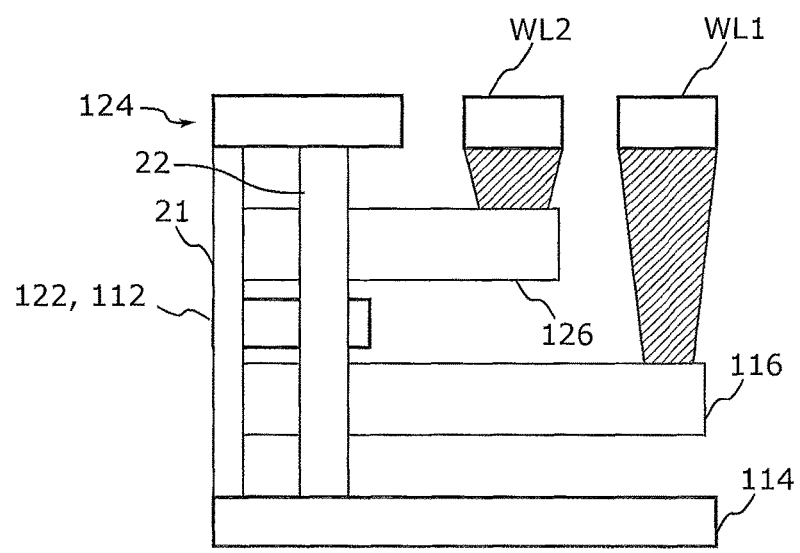
*Fig. 12*
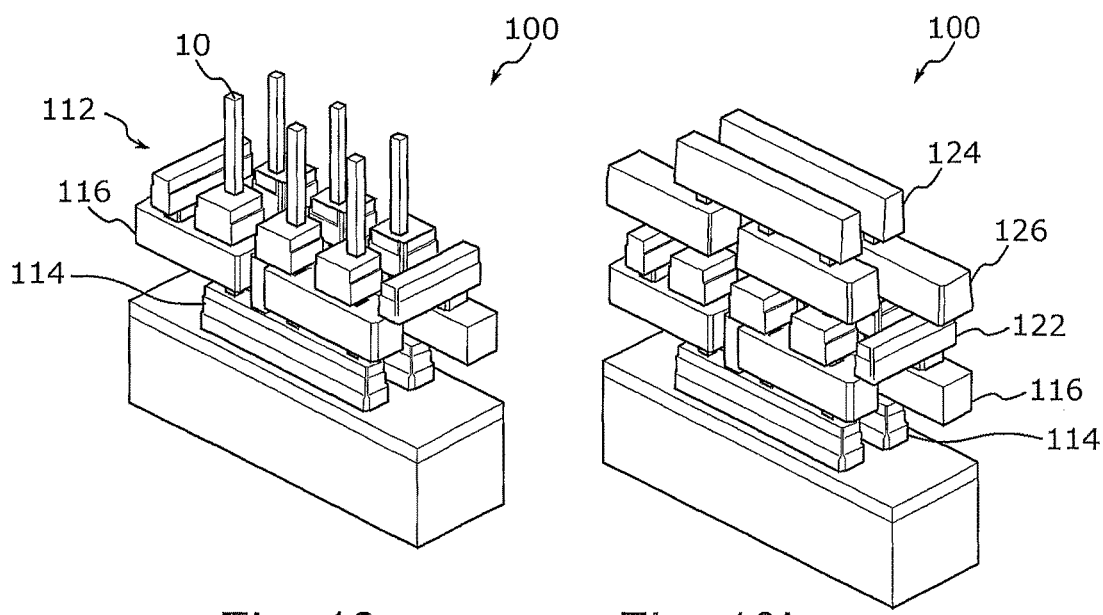
*Fig. 13a*     *Fig. 13b*

VERTICALLY STACKED SEMICONDUCTOR DEVICES HAVING VERTICAL CHANNEL TRANSISTORS

CROSS-REFERENCE TO RELATED APPLICATIONS

This application claims foreign priority to European Application No. 16174252.3, filed Jun. 13, 2016, the content of which is incorporated by reference herein in its entirety.

BACKGROUND

Field

The disclosed technology generally relates to semiconductor devices, and more particularly to semiconductor devices having a stacked arrangement, and further relates to methods of fabricating such devices.

Description of the Related Technology

The desire for reduced device footprint per memory cell or per bit in memory devices, and for increased circuit density, continues to demand decreasing gate lengths of the transistors of the memory devices. The scaling of the memory cell also continues to demand decreasing routing pitch and increased number lithographic exposures to meet the design constraints. The continued scaling, however, increases the difficulty of fabrication and/or of meeting the desired performance and/or energy consumption criteria.

Thus, there is a need for improved semiconductor technologies that allow for a further reduction of the memory cell area without impairing the performance and function of the device.

SUMMARY OF CERTAIN INVENTIVE ASPECTS

An objective of the present inventive concept is accordingly to provide a semiconductor device which allows for further reduction of the cell area without impairing the performance and function of the device. Additional and alternative objectives may be understood from the following.

According to an aspect, a semiconductor device is provided, which comprises plurality of vertical transistors. Each of the vertical transistors has a vertical channel. The vertical transistors may form a first memory device and a second memory device, wherein the first memory device and the second memory device may be at least partly stacked above each other in the vertical direction.

As described herein, a vertical transistor refers to a transistor having a channel that extends substantially in a vertical direction relative to the substrate, e.g., relative to a main surface of the substrate, used for manufacturing the semiconductor device.

According to an embodiment, the first memory device and the second semiconductor device may be at least partly aligned, e.g., to laterally overlap, with each other. At least one of the layers forming the first memory device and at least one of the layers forming the second memory device may be formed by using the same mask, thereby reducing the processing cost of the semiconductor device. Further, at least some of said layers may be aligned with each other.

According to an embodiment, the semiconductor device may comprise an interconnect layer forming a top electrode of the first memory device and a bottom electrode of the second memory device. Thus, the first and the second memory devices may share a common interconnect layer that may be arranged between the first memory device and the second memory device.

According to an embodiment, a vertical transistor of the first memory device and a vertical transistor of the second memory device may share a common vertical channel. In other words, a vertical channel of the first memory device may form a first sub-channel and a vertical channel of the second device may form a second sub-channel. These sub-channels may be vertically aligned with each other, or stacked, to form a common channel. The common channel may thus be connected to two different gates: a first gate arranged in the first memory device, and a second gate arranged in the second memory device.

According to an embodiment, the vertical channels may be vertical nanowires.

According to an embodiment, the semiconductor device may comprise two distinct and vertically separated gate levels or gate stacks, wherein a first gate may be arranged in the first memory device and the second gate may be arranged in the second memory device.

According to an embodiment, the first gate level and the second gate level may be vertically separated by an interconnect level.

According to an embodiment, the first memory device and the second memory device may physically share supply voltage lines ($V_{DD}$, $V_{SS}$).

According to an embodiment, the first memory device and the second memory device may physically share at least one of a common bitline (BL) and a complementary bitline (BLB).

According to an embodiment, the bitline and the complementary bitline may be arranged in an interconnect level between the first memory device and the second memory device.

According to an embodiment, the first memory device and the second memory device may be adapted to be controlled by two separate word lines (WL) arranged in an interconnect level between the first memory device and the second memory device.

According to an embodiment, the vertical transistors may be gate-all-around field-effect transistors (GAA FETs).

According to an embodiment the vertical transistors may be junction-less transistors.

According to an embodiment, each of the first memory device and the second memory device may be a static random-access memory (SRAM) cell.

According to an embodiment, the respective SRAM cells may be six-transistor (6T) SRAM cells, where each SRAM cell has six transistors.

According to an embodiment, the semiconductor device may comprise three or more memory devices that may be at least partly stacked above each other in the vertical direction and/or at least partly aligned with each other. Further, adjacent memory devices may share one or several interconnect layers.

According to an aspect, a method for manufacturing a semiconductor device is provided. The semiconductor device may be similarly configured as the semiconductor device according to any one of the above embodiments. The method may comprise the steps of forming a first memory device comprising a plurality of vertical transistors, and forming a second memory device comprising a plurality of vertical transistors. The first memory device and the second memory device may be at least partly stacked above each other in a vertical direction.

According to an embodiment, the semiconductor device may be formed such that a vertical transistor of the first memory device and a vertical transistor of the second memory device are aligned with each other such that they share a common vertical channel.

According to an embodiment, the method may further comprise forming an interconnect layer between the first memory device and the second memory device.

According to an embodiment, the interconnect layer may form a top electrode of the first memory device and a bottom electrode of the second memory device.

According to an embodiment, the method may further comprise forming vertical channels of the vertical transistors. The vertical channels may be formed by growing an n-type region, growing a p-type region, and etching the n-type region and the p-type region so as to form an n-type channel and a p-type channel, respectively.

According to an embodiment, the n-type region and the p-type region may be grown by means of epi growth.

According to an embodiment, the method may further comprise forming vertical channels of the vertical transistors. The channels may be formed by etching a first channel, etching a second channel, doping the first channel to form an n-type channel, and doping the second channel to form a p-type channel.

According to an embodiment, the doping may be performed by forming a doped oxide layer on the first and second channels.

Several advantages may be associated with the inventive concepts disclosed herein.

Advantageously, the stacked layout allows for the SRAM bitcell area to be reduced as much as by about 40% as compared to some non-stacked prior art devices.

In addition, masks may be shared between two tiers (except gate layer), which potentially may lower the mask cost.

In addition, a same channel material may be used for the top and the bottom device, which may simplify the channel doping.

Furthermore, electrical connections between the two tiers may be simplified, particularly if the two tiers share a common metal layer.

BRIEF DESCRIPTION OF THE DRAWINGS

Further objectives, features and advantages of the present inventive concept will be better understood through the following illustrative and non-limiting description of examples and studies, and the appended drawings. In the drawings, like reference numerals will be used for like elements unless stated otherwise.

FIG. 2a is a schematic planar-view illustration of memory devices each having a plurality of vertical transistors and having a stacked configuration, according to some embodiments.

FIG. 2b is a schematic cross-sectional view illustration of the memory device of FIG. 2a.

FIG. 3a is a schematic planar-view illustration of a memory device configured to be stacked and having a plurality of vertical transistors, according to some embodiments.

FIG. 3b is a schematic planar-view illustration of a memory device configured to be stacked and having a plurality of vertical transistors, according to some embodiments.

FIG. 12 is a schematic cross-sectional view illustration of memory devices arranged in a stacked configuration, according to some embodiments.

FIG. 13a is a schematic isometric view of a memory device configured to be stacked and having a plurality of vertical transistors, according to some embodiments.

FIG. 13b is a schematic isometric view of memory devices arranged in a stacked configuration including the memory device illustrated with respect to FIG. 13a, according to some embodiments

DETAILED DESCRIPTION OF CERTAIN ILLUSTRATIVE EMBODIMENTS

Detailed embodiments of the present inventive concept will now be described with reference to the drawings. The present inventive concept may, however, be embodied in many different forms and should not be construed as limited to the embodiments set forth herein; rather, these embodiments are provided by way of example so that this disclosure will convey the scope of the inventive concept to those skilled in the art.

The scalability of thin-body devices, e.g., FinFETs at the 5 nm node and beyond, continues to pose challenges for maintaining acceptable performance parameters such as subthreshold slope (SS) and short-channel effects (SCEs). Gate-all-around (GAA) nanowire transistors (LFET) can offer superior control of the gate over the fully-depleted channel and allow to further scale the gate length to 15 nm with the nanowire (NW) diameter of 4-7 nm. However, in a conventional 2D layout, the gate length, sidewall spacers and source/drain contacts compete for space within the devices' pitch. Additionally, an ultra-thin channel could also potentially cause a degradation in the carrier mobility due to a strong quantum confinement.

In many applications, the static random-access memory (SRAM) occupies a large portion of die size and consumes most of the standby leakages. The desired density scaling of SRAMs has forced an aggressive metal pitch (MP) and gate pitch (CGP) and demanded multiple EUV exposures to meet the tip-to-tip constraints. Meanwhile, CMOS scaling has placed SRAMs into the regime where it is difficult to meet the performance, energy and density requirements. The 2× per generation density scaling trend, sometimes referred to as Moore's Law in the relevant industry, has made SRAMs more prone to process variability and difficult to compromise read and write margins.

To address these challenges, a new device architecture named vertical GAA FETs (VFET) is being considered as a promising candidate for sub-5 nm nodes. In VFETs, the gate length may be defined vertically by the thickness of the metal-gate layer. As such, it can be relaxed without paying a penalty on the device's footprint, and it can also be used as a knob for variability optimization and leakage control. From a design layout perspective, VFETs layout allow an extra degree of freedom in the ordering of the devices which has the potential to enable further layout optimization for improving routing resources and area density.

FIGS. 1-4 illustrate SRAM cells according to various configurations, including non-stacked devices (also referred to as "conventional" or "normal"). As indicated in the figures, the SRAM cells according to the disclosed embodiments may be designed by using two stacked-gate devices. However, the concept according to the present invention may also be extended to three or more stacked devices.

Figures 1A, 1B:
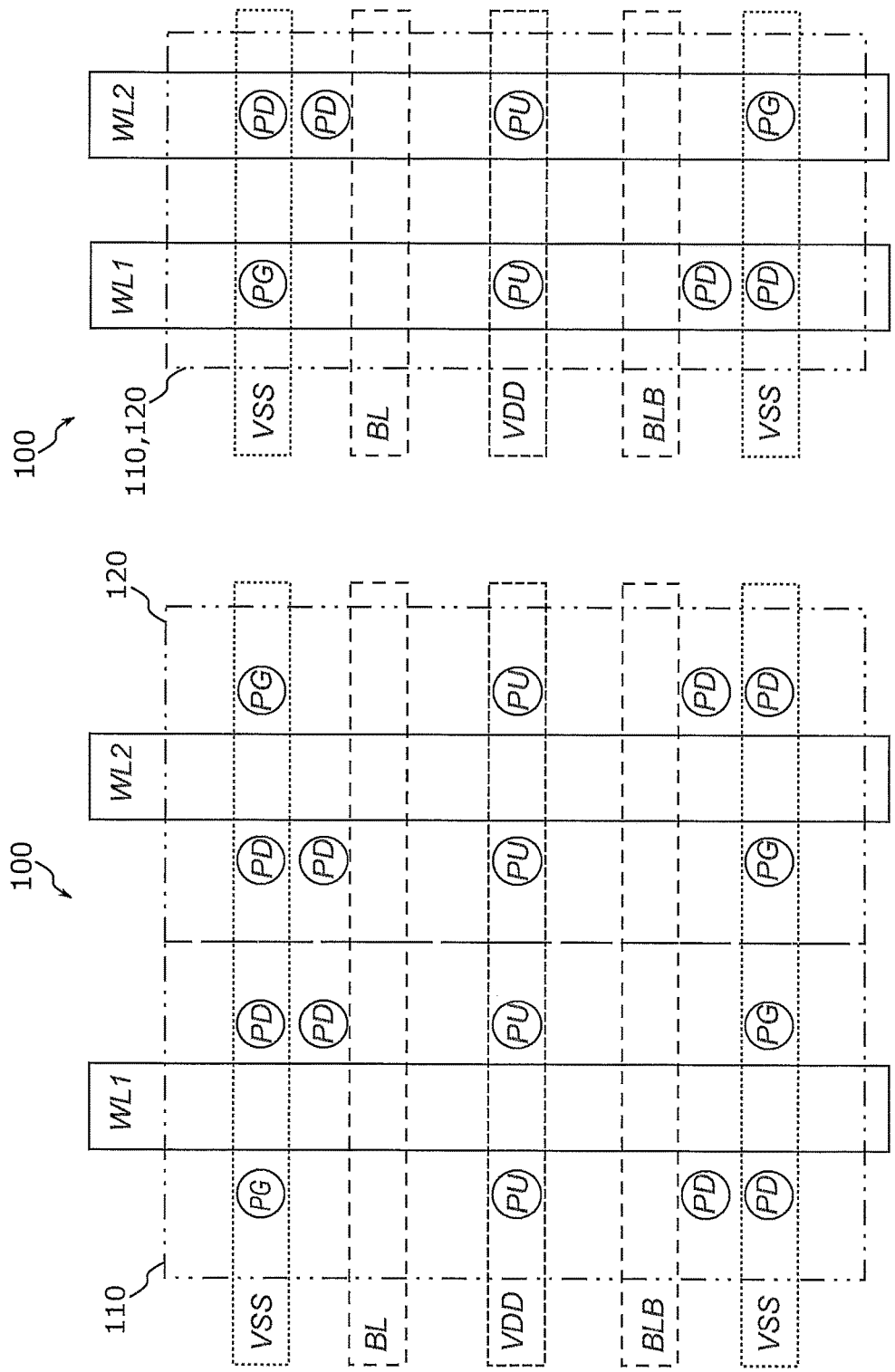
FIG. 1a is a schematic planar-view illustration of a semiconductor device comprising a plurality of vertical transistors.
FIG. 1b is a schematic planar-view illustration of a semiconductor device comprising a plurality of vertical transistors, according to some embodiments.

FIG. 1a illustrates the layout of a semiconductor device 100 comprising a first memory device 110 and a second memory device 120, such as e.g. a first and a second SRAM device 110, 120. As indicated in the present figure, the SRAM device (which also may be referred to as the SRAM memory cell or bit cell) may comprise pull-up transistors (referred to herein as PU), pull-down transistors (referred to herein as PD), and gate transistors (referred to herein as PG). The transistors may e.g. be MOS transistors, wherein the pull-up transistors PU may be PMOS transistors and the pull-down PD transistors NMOS transistors. The pull-up transistors PU may be connected to a drive current VSS or routing track VSS and the pull-down transistors to a drive current VDD or routing track VDD, whereas the gate of the pass transistors PG (which also may be e.g. MOS transistors) may be connected to a word line WL1, WL2. The source/drain of the pass transistors PG may be connected to bit lines BL, BLB. The operation of e.g. a six transistor SRAM memory device is known in the art and will not be discussed in further detail herein.

FIG. 1a is a schematic planar-view illustration of a semiconductor device comprising a plurality of vertical transistors. In FIG. 1a, the first SRAM device 110 and the second SRAM device 120 are arranged side by side in a same lateral plane. Both devices 110, 120 share the VSS, VDD, BL and BLB connection, and can be individually addressed by their respective word lines WL1, WL2.

FIG. 1b is a schematic planar-view illustration of a semiconductor device comprising a plurality of vertical transistors, according to some embodiments. FIG. 1b shows a semiconductor device 100 according to an embodiment of the inventive concept, wherein the second memory device 120 is arranged below the first semiconductor device 110 (as seen in a vertical or normal direction of the lateral or main plane of extension of the device 100). In the present example, two devices may thus share the same channel body and be stacked on top of each other, resulting in a SRAM cell with the 2 levels (top/bottom) of transistors PU, PD, PG stacked on top of each other. The top and bottom SRAM cells 110, 120 may share VDD, VSS, BL, BLB. The access to the overall SRAM cells 100 may be controlled by two separated word lines WL1, WL2.

For the implementation of the present embodiments, we propose the use of junction less (JL) transistors as the cell transistors, though the concept can be expanded to consider the more conventional inversion-mode type of devices. Attractiveness of using JL is the considerable process simplification (and hence also cost) it enables since these type of devices do not require junctions, thus allowing one to avoid the issues and challenges of precise junction formation in vertical devices. Experimentally these types have shown relatively low IOFF and improved reliability (possibly due to a lower oxide field at operating conditions), an important feature also for SRAMs.

FIG. 2a is a schematic planar-view illustration of memory devices each having a plurality of vertical transistors and having a stacked configuration, according to some embodiments. In particular, FIG. 2a shows an example layout of a six-transistor (6T) SRAM cell, comprising two pass transistors PG, a pair of pull-up transistors PU and a pair of pull-down transistors PD. The gate contact layer 116 is indicated by a hatched region. It should be noted that a transistor may be formed of one or several vertical channels, as indicated for the pull-down transistors PD of the present figure.

FIG. 2b shows a vertical cross section of the device 110 of FIG. 2a, taken along the line A'-A". The pull-down transistor PD may comprise a gate contact 116 and two vertical channels 10, and be arranged between a top electrode 112 comprising the VSS contact, and a bottom electrode 114 comprising. Similarly, the pull-up transistor PU may comprise a vertical channel 10 and share the gate contact 116 with the pull-down transistor PD. As indicated in the figure, the top electrode 112 may further comprise a VDD contact connected to the pull-up transistor PU. The pass transistor PG may comprise a vertical channel 10 surrounded by a gate contact 116, which may be disconnected from the pull-up transistor PU and the pull-down transistor PD. The gate contact 116 of the pass transistor PG may instead be connected to the word line WL.

Figure 3C:
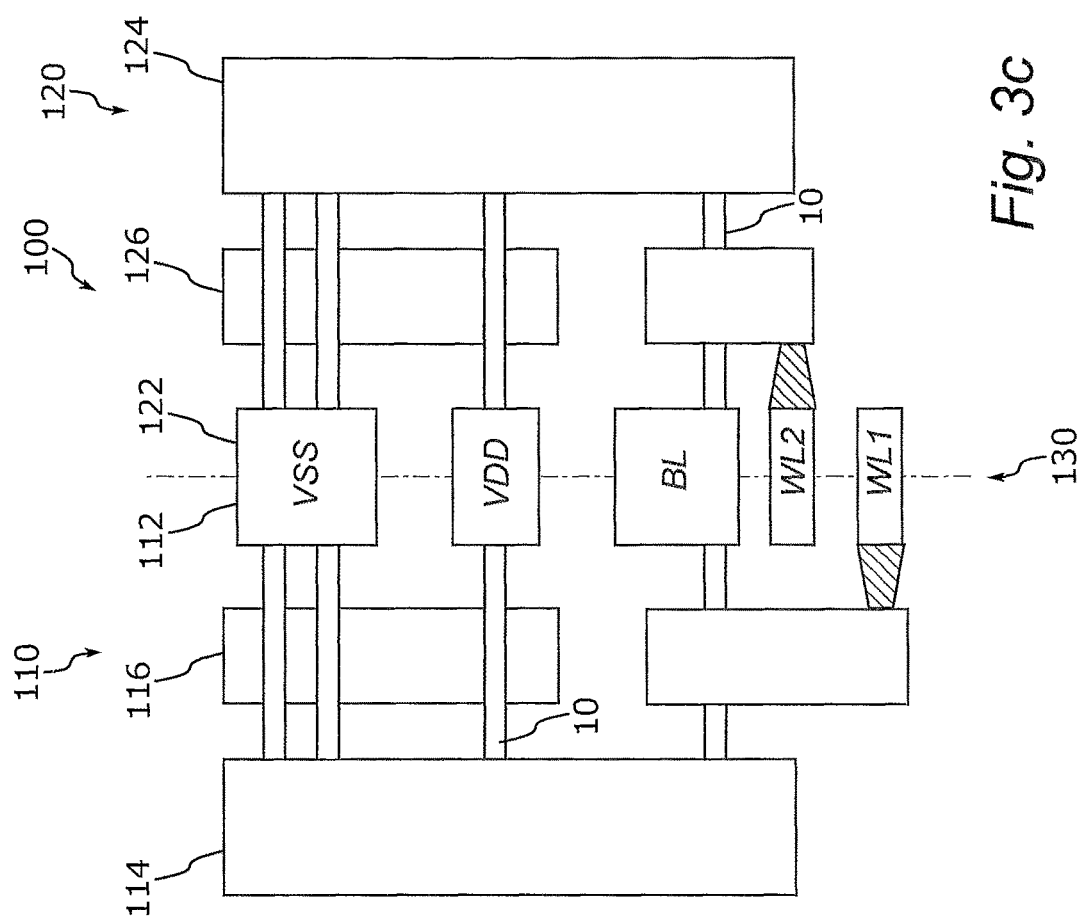
FIG. 3c is a schematic cross-sectional view illustration of memory devices of FIGS. 3a and 3b arranged in a stacked configuration, according to some embodiments.

FIGS. 3a and 3b show a first memory device 110 and a second memory device 120, which may be similarly configured as the devices discussed with reference to the previous figures, having a top electrode 112, 124 and a bottom electrode 114, 122. In FIG. 3c, a combined semiconductor device 100 is illustrated, wherein the first memory device 110 is arranged above the second memory device 120

(as seen in the direction of the vertical channels 10). Consequently, the first and second memory devices 110, 120 share a common interconnect layer 130, comprising the top electrode layer 112 of the first memory device 110 and the top electrode layer 124 of the second memory device 120. As indicated in the present figure, the transistors of the respective devices 110, 120 may share a common channel 10.

Figure 4A:
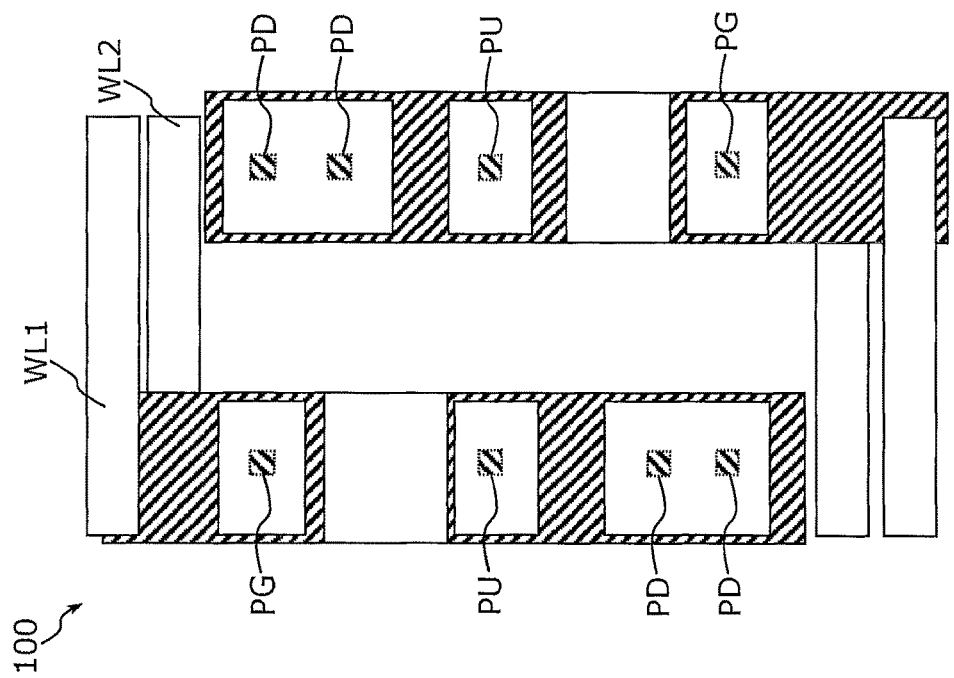
FIG. 4a is a schematic planar-view illustration of a memory device configured to be stacked and having a plurality of vertical transistors, according to some embodiments.
Figure 4B:
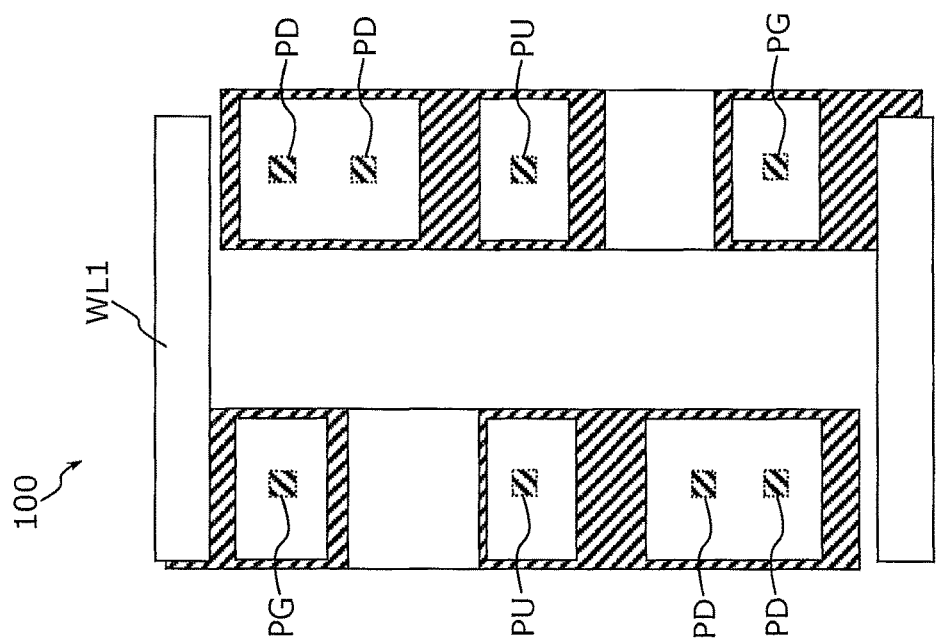
FIG. 4b is a schematic cross-sectional view illustration of memory devices arranged in a stacked configuration, according to some embodiments.

FIG. 4a shows a top view of similar device as in FIGS. 2a and 3a, whereas FIG. 4b shows a top view of a similar device as in FIG. 3c, in which the first memory device 110 is aligned with and arranged above the second memory device 120. The second memory device 120 is therefore not shown in the top view of FIG. 4b, but merely indicated by the second word line WL2 connected to the pass gate contact 126 of the pass transistor PG of the second memory device 120.

Table 1 below is an exemplary, non-limiting comparison between a prior art VFET layout and a layout with stacked-VFET according to some embodiments.

TABLE 1

| Parameters | VFET | Stacked-VFET |
|---|---|---|
| SRAM types | 112/122 | 112/122 |
| Width [nm] | 64 | 64 |
| Height [nm] | 198 | 242 |
| Area [um2] | 0.0129 | 0.0155 |
| Area/bit [um2/bit] | 0.0129 | 0.0077 |
| Area reduction | NA | 40% |

Figure 5A:
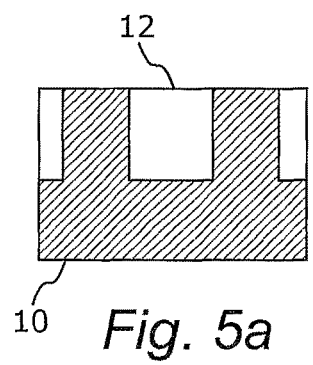
FIGS. 5a-5f schematically illustrate intermediate structures at various stages of fabricating a semiconductor device comprising a plurality of vertical transistors, according to some embodiments.
Figure 5B:
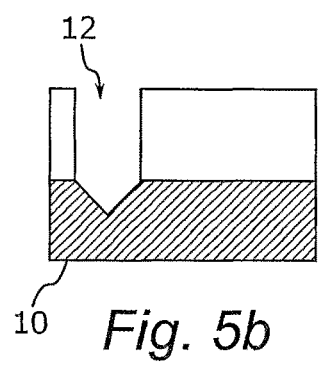
Figure 5C:
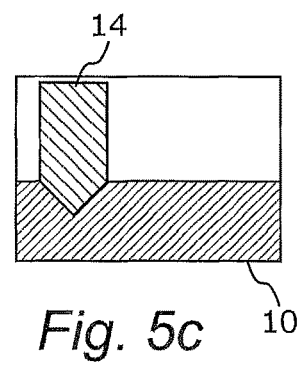
Figure 5D:
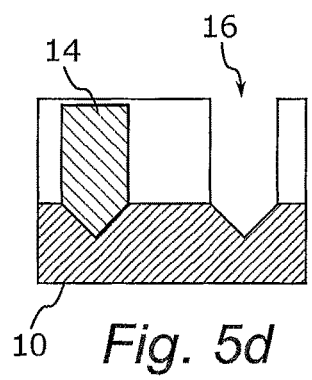
Figure 5E:
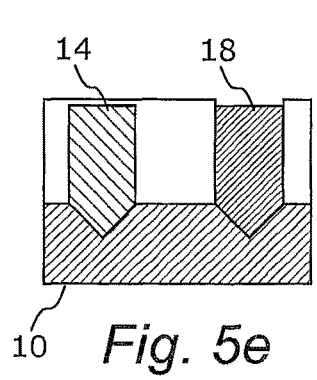
Figure 5F:
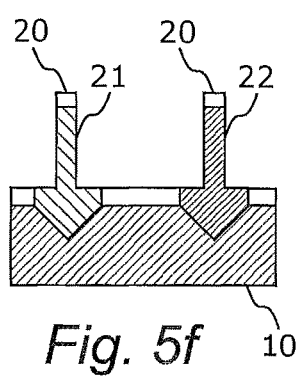
Figure 6A:
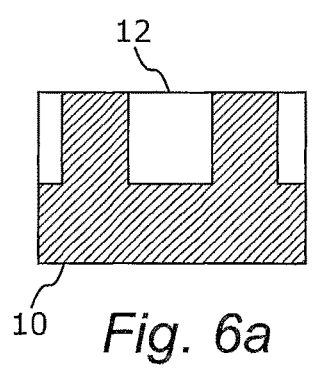
FIGS. 6a-6e schematically illustrate intermediate structures at various stages of fabricating a semiconductor device comprising a plurality of vertical transistors, according to some embodiments.
Figure 6B:
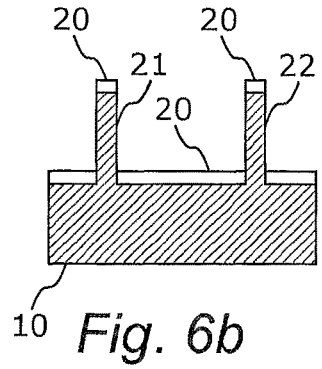
Figure 6C:
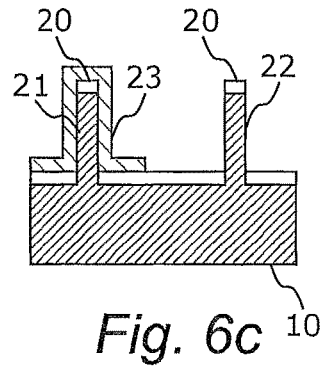
Figure 6D:
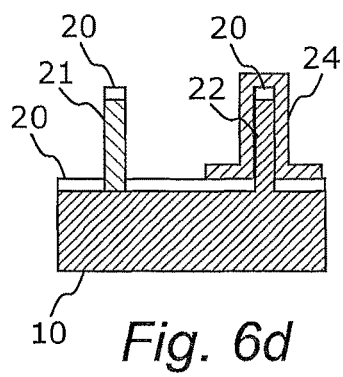
Figure 6E:
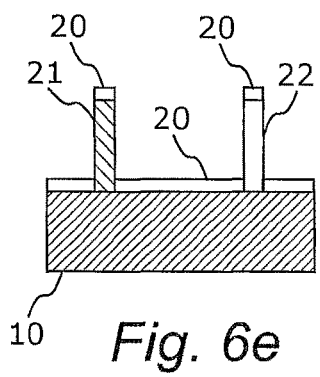

With reference to FIGS. 5a-5f and 6a-6e, two exemplary methods for defining the vertical nanowires in the cells are proposed. FIGS. 5a-5f schematically illustrate intermediate structures at various stages of fabricating a semiconductor device comprising a plurality of vertical transistors, according to some embodiments. In particular, FIGS. 5a-f disclose n/p-type wires defined by a selective wide-field epi-growth approach followed by pillars etch. According to this exemplary method, a first trench 12 may be recessed into an oxide layer (of e.g. SiO$_2$) formed on a substrate 10 (of e.g. silicon), and then refilled with a first doped semiconductor material, e.g., an n+ material 14, formed by, e.g. epitaxial growth. Further, a second trench 16 may be formed, similarly to the first trench 12, and filled with a second doped semiconductor material, e.g., a p+ material 18, formed by, e.g., epitaxial growth. As shown in FIG. 5f, a first pillar 21 (forming e.g. the NMOS transistor channel) and a second pillar 22 (forming e.g. the PMOS transistor channel) may be formed by etching the first and second doped semiconductor materials, respectively.

As described herein and throughout the specification, it will be appreciated that the semiconductor substrate 10 can be implemented in a variety of ways, including, but not limited to, a doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials.

Still referring to FIGS. 5f-5f and throughout the specification, in some embodiments, the first and second semiconductor materials may be formed of the same semiconductor material as the substrate 10. In some other embodiments, one or both of the first and second semiconductor materials may be formed of a different semiconductor material from the substrate 10. For example, the substrate 10 may be formed of silicon, whereas the first or second semiconductor materials may be formed of SiGe, Ge or any of the compound semiconductor materials.

FIGS. 6a-6e discloses another exemplary method for forming the n/p-type wires. In this example, the pillar structures may be defined by a pillar etch, using e.g. a hard mask 20. This step may be followed by pillar doping, wherein a heavily n-doped first oxide layer 23 may be formed on to surround the first pillar 21 and a heavily p-doped second oxide layer 24 may be formed on to surround the second pillar 22. The dopants may be diffused into the respective pillars 21, 22 by thermal annealing. In some embodiments, dopant diffusion may be performed subsequent to formation of the n-doped first oxide layer 23 and the p-doped second oxide layer 24 surrounding the first pillar 21 the second pillar 22, respectively. In some other embodiments, dopant diffusion may be performed in situ while the doped oxide is being deposited.

Figure 7:
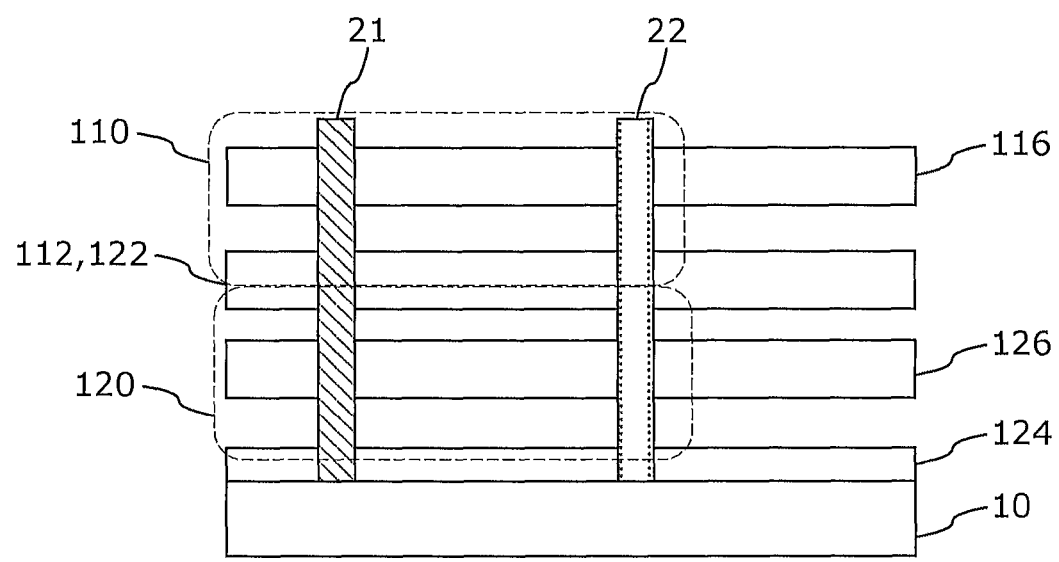
FIG. 7 is a schematic cross-sectional view illustration of memory devices arranged in a stacked configuration, according to some embodiments.

FIG. 7 shows a simplified cross-section view of a NMOS/PMOS bottom and top transistors in the cell. The cell comprises a first pillar 21, forming the channel of NMOS transistors of the first and second memory devices 110, 120, and a second pillar 22 forming the channel of PMOS transistors of the first and second memory devices 110, 120.

Definition of the two gate levels 116, 126 and the metal line or top electrode 112 of bottom transistor 120 correspond to the bottom electrode 122 of top transistor 120 are advantageous integration elements on the overall flow for the two levels-SRAM fabrication.

Figures 8A, 8B:
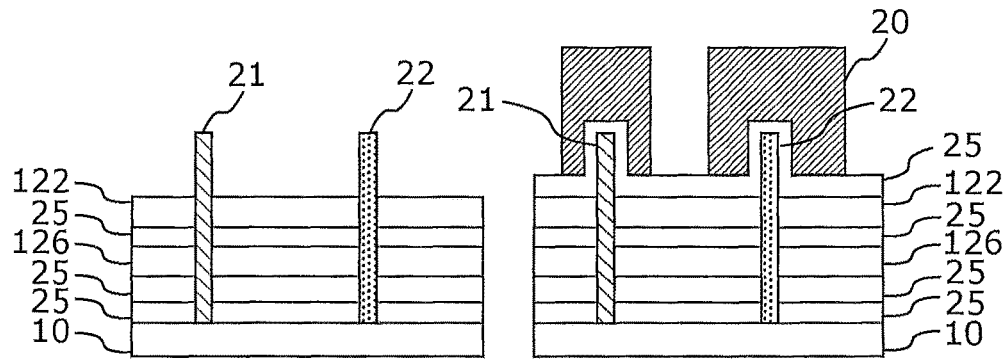
FIGS. 8a-8d schematically illustrate intermediate structures at various stages of fabricating a semiconductor device comprising a plurality of vertical transistors, according to some embodiments.
Figure 8C:
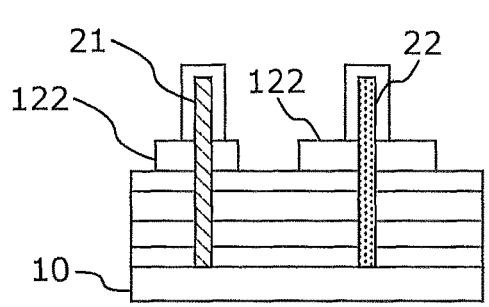
Figure 8D:
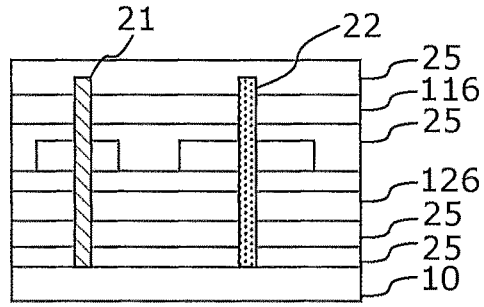
Figure 9:
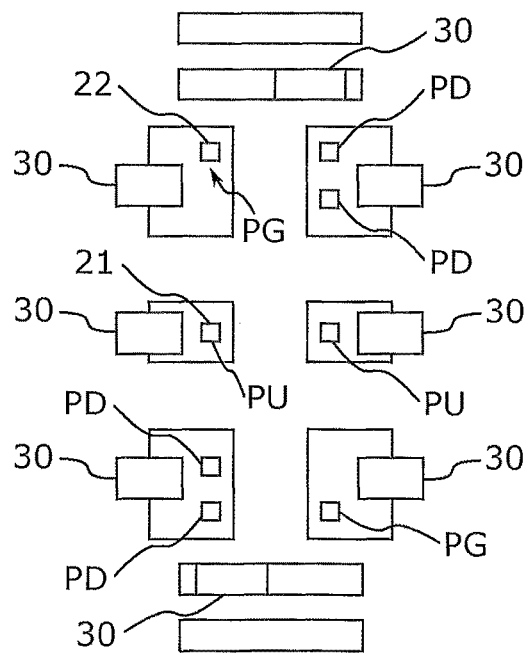
FIG. 9 schematically illustrate a planar-view illustration of a memory device having a plurality of vertical transistors and fabricated according to the fabrication method illustrated with respect to FIGS. 8a-8d, according to some embodiments.

FIGS. 8a-8d illustrate an exemplary method for forming the interconnect layer 130, comprising the bottom electrode 112 of the first memory device 110 and the top electrode 122 of the second memory device 120. As shown in FIG. 8a, the second memory device 120 may be formed of the first and second pillar 21, 22, extending through a stack comprising a gate layer 126 arranged between isolating layers 25. On top of this stack, a top electrode layer 122 may be arranged. In FIG. 8b, an isolating layer 25 has been formed on the top electrode layer 122, and the pattern to be transferred to the top electrode layer 122 formed by means of lithography on a resist layer 20. After the patterning of the top electrode layer 122, isolation 25 and a gate layer 116 of the first memory device 110 may be formed. FIG. 9 shows a top view of an exemplary memory device resulting from the method of FIGS. 8a-d, comprising contact vias 30 to the underlying patterned intermediate layer 130.

Figures 10A, 10B:
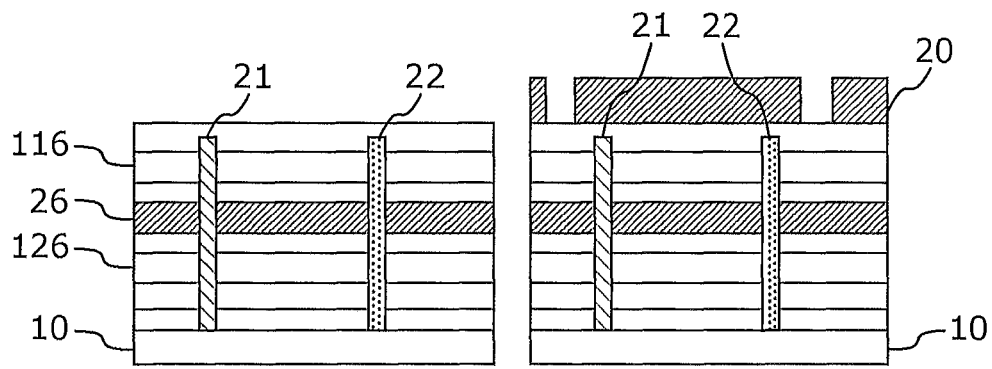
FIGS. 10a-10e schematically illustrate intermediate structures at various stages of fabricating a semiconductor device comprising a plurality of vertical transistors, according to some embodiments.
Figures 10C, 10D:
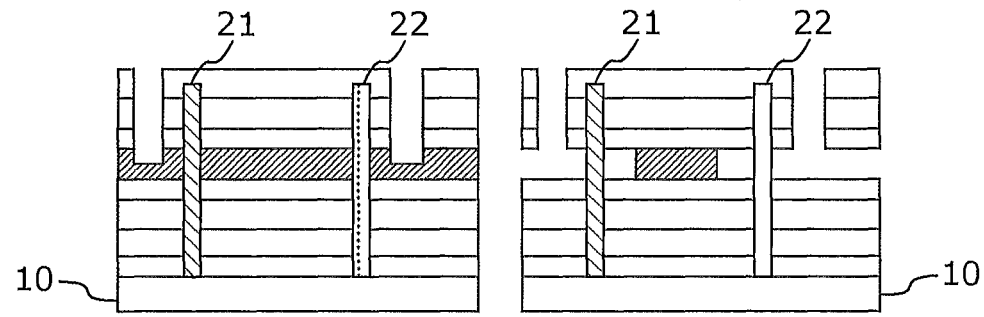
Figure 10E:
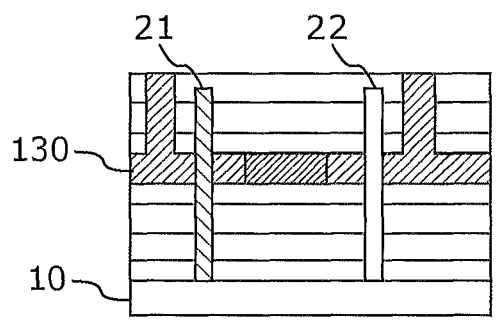

FIGS. 10a-10e show an alternative method to the method of FIGS. 8a-d, using a replacement metal gate (RMG) type of process. The stack of layers may comprise a dummy layer 26 or sacrificial layer 26 arranged in the position where the intermediate layer 130 is to be formed. In FIGS. 10b and c, vias are opened to the dummy layer 26 which then may be selectively removed to expose the portion of the pillars 21, 22 to be contacted by the intermediate layer 130. The metal of the intermediate layer 130 may then be deposited to fill the space previously occupied by the dummy layer 26. Prior to the deposition of the metal of the intermediate layer 130, an additional doping of the wires 21, 22 in the region of the intermediate layer 130 may be added to the flow in order to lower the series resistance of the devices (hence increase ION) and also allow better contact resistivity for the intermediate layer 130. Such additional doping could be achieved with selective growth of additional doped-epi or through selective dopant diffusion into the wires from a selectively deposited high-doped material (e.g., $SiO_2$) on the wafer.

Figures 11A, 11B:
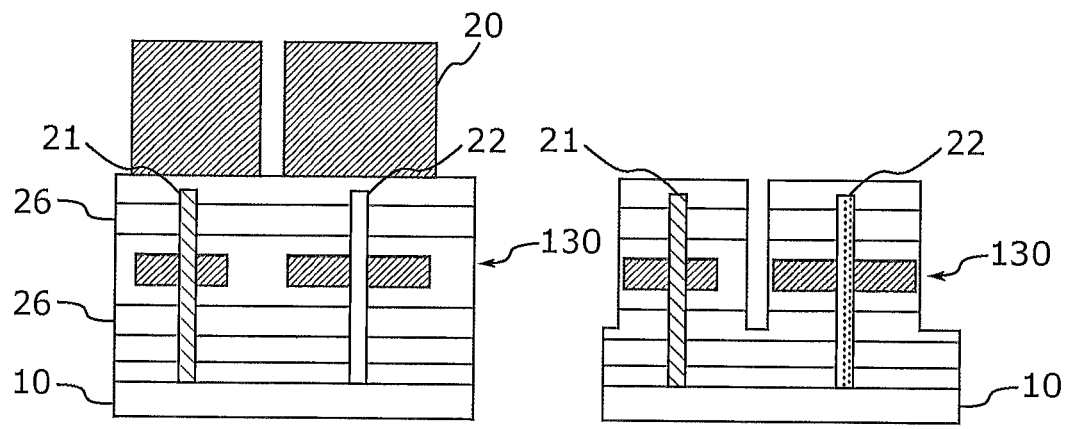
FIGS. 11a-11e schematically illustrate intermediate structures at various stages of fabricating a semiconductor device comprising a plurality of vertical transistors, according to some embodiments.
Figures 11C, 11D:
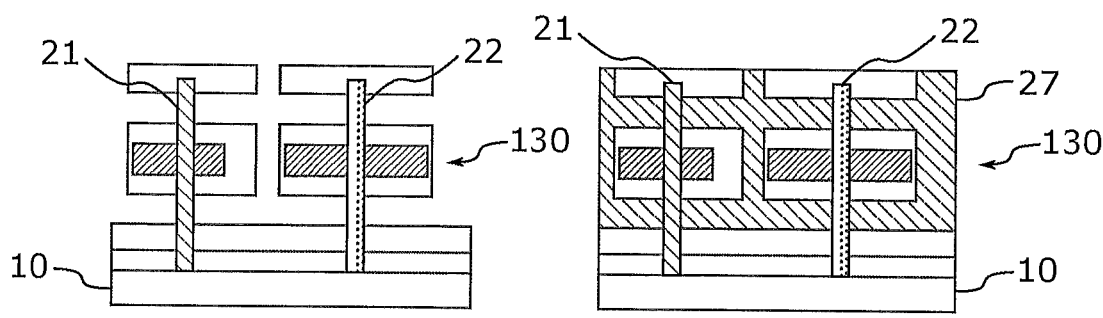
Figure 11E:
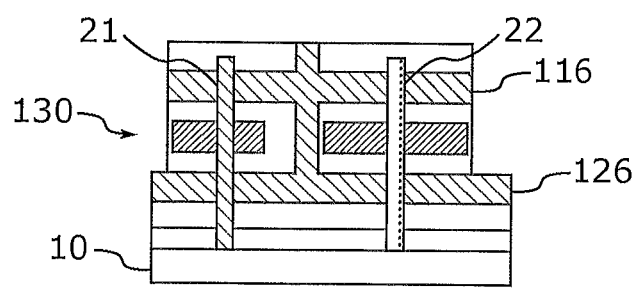

The two gate levels 116, 126 may be formed by means of a RMG process similar to the one described in connection with FIGS. 10a-d. An example of such method is disclosed in FIGS. 11a-e, although the concept could also be extended to a Gate-First type of process. An advantage of RMG (besides enabling making the two gate levels 116, 126 at the same time) is that it allows more knobs for improving the gate stack performance and reliability and it also allows local shrinkage of pillars CD after removal of the dummy-gates and prior to the gate stack deposition (namely by applying cycles of oxidation and oxide-removal) for the case of a Si channel but also of a high-mobility channel (e.g., other group IV, IIIV channels). As shown in FIGS. 11a-c, the stack of layers forming the first and second memory devices may be provided with one or several vias for accessing a dummy layer 26, provided in positions in which the gate layers 116, 126 are to be defined, such that the dummy layer 26 can be removed by e.g. selective etching. The etched structure may then be filled with the gate material to form the gate layers 116, 126 on each side of the intermedia layer 130, as shown in FIG. 11d. Finally, the deposited gate material may be anisotropically etched for separating the gate levels 116, 126 of the respective devices 110, 120.

FIG. 12 shows a cross sectional portion of a first and a second memory device 110, 120, having a first and a second nanowire channel 21, 22 extending vertically between a bottom electrode 114 of the first memory device 110 and a top electrode 124 of the second memory device 120. The nanowires 21, 22 are at least partly surrounded by a first and a second gate contact 116, 126, which are connected by means of a via connection to a respective word line WL1, WL2.

FIGS. 13a and 13b show a schematic perspective view of a semiconductor device 100 according to an embodiment, which may be similarly configured as the devices discussed in connection with the previous figures. In FIG. 13a, the first memory device 110 has been formed around six nanowires 10. The first memory device 110 comprises a bottom electrode layer 114, a top electrode layer 112 and a first gate layer 116. In FIG. 13b, the second memory device 120 have been added above the first memory device 110 such that the transistors of the second memory device 120 share the channel body 10 (i.e., nanowire) with the respective transistors of the underlying, first memory device 110. The second memory device 120 thus comprises a bottom electrode layer 122 that is shared with the top electrode layer of the first memory device 110, a second gate contact layer 126 and a top electrode layer 124.

Figure 14:
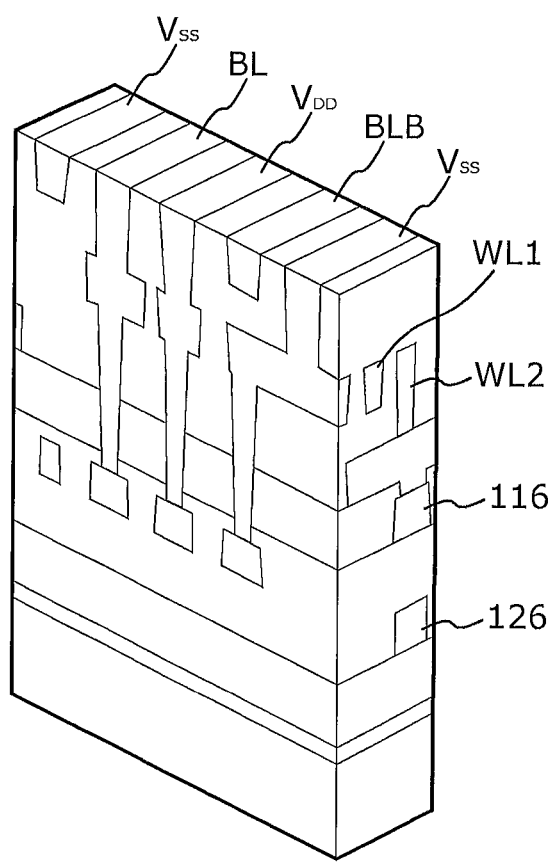
FIG. 14 is a schematic isometric view of memory devices each having a plurality of vertical transistors and arranged in a stacked configuration, according to some embodiments

FIG. 14 show a perspective view of a cross sectional portion of a semiconductor device 100 similarly configured as the semiconductor device 100 of FIG. 13b, showing the connection to the grid of power lines VSS, VDD and the underlying layer of word lines WL1, WL2, orthogonal to the power lines VSS, VDD. The transistors may thus be junction less (JL), and may share $V_{DD}$, $V_{SS}$, BL and BLB while access to the full 12T-SRAM may be controlled by the two separate word lines WL1, WL2. This layout has showed a 39% area reduction per bit compared to prior art SRAM design, and allows for simplified interconnects.

Experimental Study

In the following, an experimental setup of gate-all-around (GAA) nanowire FETs (NWFETs) will be discussed. The study concerns an evaluation of junction less (JL) vs. conventional inversion-mode (IM) GAA-NWFETs with the same lateral (L) configuration. Lower $I_{OFF}$ values and excellent electrostatics may be obtained with optimized NW doping for a given JL NW size (WNW less than or equal to 25 nm, $H_{NW}$ about 22 nm), with increased doping allowing for $I_{ON}$ improvement without $I_{OFF}$ penalty for $W_{NW}$ less than or equal to 10 nm. These devices also appear as a viable option for analog/RF, showing similar speed and voltage gain, and reduced LF noise as compared to IM NWFETs. VT mismatch performance shows higher AVT with increased NW doping for JL NMOS, with less impact seen for PMOS and at smaller NWs. The JL concept is also demonstrated in vertical (V) GAA-NWFETs with in-situ doped Si epi NW pillars ($d_{NW}$ of 20-30 nm or more), integrated on the same 300 mm Si platform as lateral devices. Low $I_{OFF}$, $I_G$, and good electrostatics may be achieved over a wide range of $V_{NW}$ arrays.

GAA-NWFETs with the gate fully wrapped around the device body, which may increase electrostatics control, are considered a promising candidate for (e.g., sub-5 nm). Moreover, some GAA-NWFETs can be configured as junctionless (JL) GAA-NWFETs which do not have PN junctions, which may offer great process simplicity as they may omit formation of PN junctions. Furthermore, some JL GAA-NWFETs do not have $P^+P$, $PP^-$, $N^+N$ nor $NN^-$ junctions. That is, some junctionless GAA-NWFETs comprise s homogenously doped semiconductor resistor whose mobile carrier density can be modulated by a gate. JL GAA-LNWFETs has shown to yield well-performing SRAM cells, ring oscillators with substantially lower power dissipation and improved reliability thanks to a lower oxide field at operating conditions. These devices may however also be a viable option for analog/RF applications and explore in-depth the impact/control of NW doping and size on noise, variability, and DC performance. Process simplicity makes this type of devices also potentially attractive for use in a sequential 3D context or in vertical FETs, which may bring new opportunities for design layout as scaling is being challenged by factors such as the physical limits on gate and contact placement and interconnect routing congestion. Also, since the gate length ($L_{gate}$) may be defined vertically in these devices, it can be relaxed without area penalty and used as a knob for variability optimization and leakage control. Furthermore, the JL simplicity may be explored by introducing a novel SRAM design with vertically stacked devices.

Process flows that may be used for lateral and vertical GAA-NWFET devices fabrication will be discussed in the following. For lateral, starting from a triple-gate SOI-finFET flow: GAA may be achieved via a fins release process at RMG module; JL channel doping may be obtained by ion implantation (B for PMOS, P for NMOS), followed by spike anneal, prior to dummy-gate formation. IM-GAA were in this study built for comparison. For vertical, in a simplified flow with the substrate as bottom electrode, up to three stacked layers of uniformly doped (B for PMOS) Si epi were grown (ASM Epsilon™) and patterned into arrays of vertical NW pillars. A gate first (GF) process was used with alternative schemes introduced to overcome etch-back layout dependences (bottom isolation and gate levels) and obtain a smoother W gate surface. Similar $HfO_2$/TiN/W gate stack was used for all devices.

The $I_D$-$V_G$ characteristics may illustrate a trade-off for controlling JL devices: NW doping vs. NW size, with higher doping requiring a smaller NW to be able to fully turn off the device. In this study, NW height ($H_{NW}$) in LNWFETs was kept constant at about 22 nm, while NW width ($W_{NW}$) ~2→25 nm. The impact on $V_T$, DIBL and SS for p-type JL may be compared with two versions of IM GAA-NWFETs with similar $N_w$ sizes. AVT vs. $\Delta W_{NW}$ shows a less pronounced slope for lowly doped JL FETs, becoming steeper for increased NW doping. JL show excellent electrostatics (SS, DIBL) compared to IM FETs, provided the NW size is kept sufficiently small ($W_{NW}\leq$10 nm) when its doping is higher. This may impact on $I_{ON}$ and $I_{OFF}$, with similar trends seen for n and p-type JL vs. IM NWFETs: they can exhibit lower $T_{OFF}$ for a given NW size; higher doping may help to increase $I_{ON}$ but it may be interesting only for the smaller NWs to avoid impacting $I_{OFF}$. Comparing the devices LF noise behavior, both N/PMOS show lower normalized input-referred noise spectral density values for JL vs. IM NWFETs, indicating less traps/defects present. A small noise reduction is also observed with decreasing NW doping for p-type JL, with the noise origin identified to be in this case due to carrier number fluctuations or oxide trapping with correlated mobility fluctuations. The VT mismatch performance of n-type JL GAA-NWFETs may degrade with increased NW doping and in comparison with IM GAA-NWFETs, but the impact seems less for smaller NWs ($W_{NW}\leq$10 nm) and for PMOS.

From an analog perspective, $f_T$ values comparison indicates comparable speeds for JL and IM NWFETs (N/PMOS; same layout) may be achieved, with lower JL NW doping beneficial. Examples of the frequency dependency on ID for p/n-type JL devices indicates an $f_T$, $f_{max}$ increase for smaller $L_{gate}$ and the possible improvement in $f_{max}$ through layout optimization. Similar $g_m/I_D$ vs. $I_D$ characteristics have been observed for JL and IM devices, indicating comparable current efficiency for analog purposes, and in agreement with the device's good electrostatic properties. Voltage gain ($A_V$) and $g_m$ vs. $I_D$ also show overall similar good values for the different NWFETs, with the higher doped JL devices exhibiting a slightly improved AV despite a bit lower peak $g_m$.

JL process simplicity, by avoiding the need for precise junction formation, is also particularly attractive for use in vertical FETs. The trade-offs/knobs for optimum JL operation may be similar in V/L NWFETs. TCAD results confirm some of these trends: 1) $V_T$ modulation by NW doping is more pronounced for larger NWs; 2) for uniformly doped wires, $I_{ON}$ peaks at a certain NW doping concentration, varying with NW diameter ($d_{NW}$), and higher for smaller $d_{NW}$; and 3) introduction of highly doped S/D areas is desirable for $R_{SD}$ reduction (hence improved $I_{ON}$), especially for the smaller dNW. Epi stacks may be grown to address the latter point, while having the option for a wide doping range in the channel. ID-VG curves of simplified VNWFETs with uniformly doped wires and doped substrate as bottom electrode have shown to emphasize the low $T_{OFF}$, $I_G$ values (doping condition adapted to NW size), and $\Delta V_T$ with varying NW doping. A good $I_D$, $I_G$ control over a wide range of VNW arrays, with higher NW doping, may have minor impact on gate leakage. Similar good control is reported for VNW arrays with $d_{NW}$ up to ~50 nm and $L_{gate}$~70 nm. Three stacked epi layer may provide overall good electrostatics for VNWFETs with three stacked epi layers in the wires. Larger arrays of matched pair devices may show smaller $\sigma(\Delta V_T)$ values, which include some OPC and patterning layout dependences contributions. Lastly, taking advantage of JL process simplicity (without junction formation), FIG. 14 as previously discussed proposes a SRAM cell design using two vertically stacked devices with the same type of channel doping (n/n or p/p) such that e.g. a 6T-SRAM cell may be stacked on top of another 6T-SRAM cell. They may share $V_{DD}$, $V_{SS}$, BL and BLB while access to the full 12T-SRAM may be controlled by two separate word lines (WL). An advantage is a 39% area reduction per bit vs. standard SRAM design, with simplified interconnects. Easiness of stacking JL devices also opens possibilities for other SRAM designs, namely to explore performance as in.

The thorough evaluation of scaled JL vs. IM lateral GAA-NWFETs of the exemplary study as discussed above highlighted JL excellent electrostatics, low $I_{OFF}$ and reduced LF noise, with optimum NW doping vs. size explored. The JL concept was also demonstrated in vertical GAA-NWFETs with good control over a wide range of NW arrays. JL appear as a viable option for analog/RF, with similar speed and voltage gain to 1M devices. Their $V_T$ mismatch performance may degrade with increased NW doping, but less for smaller NWs ($W_{NW}\leq$10 nm) and for PMOS. Lastly, a stacked JL VNWFET-based SRAM cell was proposed to reduce SRAM area per bit by 39%.

The foregoing is illustrative of example embodiments and is not to be construed as limiting thereof. Although example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device comprising:
    a semiconductor substrate having a main surface;
    a first memory device and a second memory device formed over the substrate and at least partly stacked in a vertical direction intersecting the main surface,
    wherein each of the first and second memory devices has a plurality of vertical transistors, wherein each of the vertical transistors is a gate-all-around junctionless nanowire field-effect transistor having no PN junction formed therein and having a vertical channel extending in the vertical direction that is fully surrounded by a gate electrode, and
    wherein each of the first and second memory devices has a top electrode and a bottom electrode that are separated in the vertical direction; and
    an interconnect layer configured to serve simultaneously as the top electrode of the first memory device and the bottom electrode of the second memory device.

2. The semiconductor device according to claim 1, wherein the first memory device and the second semiconductor device overlap each other in a horizontal direction with respect to the main surface.

3. The semiconductor device according to claim 1, wherein a vertical transistor of the first memory device and a vertical transistor of the second memory device share a common vertical channel.

4. The semiconductor device according to claim 1, comprising two distinct and vertically separated gate levels, wherein a first gate level is arranged in the first memory device and the second gate level is arranged in the second memory device.

5. The semiconductor device according to claim 4, wherein the first gate level and the second gate level are vertically separated by an interconnect level.

6. The semiconductor device according to claim 1, wherein the first memory device and the second memory device physically share supply voltage lines ($V_{DD}$, $V_{SS}$).

7. The semiconductor device according to claim 1, wherein the first memory device and the second memory device physically share one or both of a common bitline (BL) and a complementary bitline (BLB).

8. The semiconductor device according to claim 7, wherein the bitline and the complementary bitline are arranged in an interconnect level between the first memory device and the second memory device.

9. The semiconductor device according to claim 1, wherein the first memory device and the second memory device are adapted to be controlled by two separate word lines (WL) arranged in an interconnect level between the first memory device and the second memory device.

10. The semiconductor device according to claim 1, wherein each of the first memory device and the second memory device is a static random-access memory (SRAM) cell.

11. The semiconductor device according to claim 10, wherein the SRAM cell is a six-transistor (6T) SRAM cell.

12. A method of manufacturing a semiconductor device, the method comprising:
providing a semiconductor substrate having a main surface;
forming a first memory device comprising a plurality of vertical transistors over the substrate; and
forming a second memory device comprising a plurality of vertical transistors over the substrate,
wherein the first memory device and the second memory device are at least partly stacked above each other in a vertical direction crossing the main surface,
wherein each of the first and second memory devices has a plurality of vertical transistors, wherein each of the vertical transistors is a gate-all-around junctionless nanowire field-effect transistor having no PN junction formed therein and having a vertical channel extending in the vertical direction that is fully surrounded by a gate electrode, and
wherein each of the first and second memory devices has a top electrode and a bottom electrode that are separated in the vertical direction; and
forming an interconnect layer configured to serve simultaneously as the top electrode of the first memory device and the bottom electrode of the second memory device.

13. The method according to claim 12, wherein a vertical transistor of the first memory device and a vertical transistor of the second memory device are aligned with each other such that they share a common vertical channel.

14. The method according to claim 12, further comprising forming the interconnect layer between the first memory device and the second memory device.

15. The method according to claim 12, wherein a same mask is used for forming at least one layer of the first memory device and at least one layer of the second memory device.

16. The method according to claim 12, further comprising:
forming vertical channels having opposite dopant types, comprising:
growing an n-type region,
growing a p-type region, and
etching the n-type region and the p-type region so as to form an n-type channel and a p-type channel, respectively.

17. The method according to claim 16, wherein forming the vertical channels comprises epitaxially growing the n-type region and the p-type region.

18. The method according to claim 12, wherein forming the vertical transistors of each of the first memory device and the second memory device comprises forming vertical channels, forming the vertical channels comprising:
etching the semiconductor substrate to form a first vertical channel,
etching the semiconductor substrate to form a second vertical channel,
doping the first vertical channel to form an n-type channel, and
doping the second vertical channel to form a p-type channel.

19. The method according to claim 18, wherein doping the first vertical channel comprises forming a first oxide comprising an n-type dopant and diffusing the n-type dopant into the first vertical channel, and doping the second vertical channel comprises forming a second oxide comprising a p-type dopant and diffusion the p-type dopant into the second vertical channel.

* * * * *

UNITED STATES PATENT AND TRADEMARK OFFICE
CERTIFICATE OF CORRECTION

PATENT NO. : 11,018,235 B2  
APPLICATION NO. : 15/349904  
DATED : May 25, 2021  
INVENTOR(S) : Huynh Bao et al.

Page 1 of 1

It is certified that error appears in the above-identified patent and that said Letters Patent is hereby corrected as shown below:

In the Specification

In Column 4, Line 56, delete "embodiments" and insert --embodiments.--.

In Column 4, Line 59, delete "embodiments" and insert --embodiments.--.

In Column 7, Line 62, delete "FIGS. 5*f*-5*f*" and insert --FIGS. 5*a*-5*f*--.

In Column 10, Line 27, delete "junctionsless" and insert --junctionless--.

In Column 11, Line 4, delete "AVT" and insert --$\Delta$VT--.

In Column 11, Line 11, delete "TOFF" and insert --IOFF--.

In Column 11, Line 53, delete "TOFF," and insert --IOFF,--.

In Column 12, Line 16, delete "1M" and insert --IM--.

Signed and Sealed this  
Twenty-fourth Day of August, 2021

Drew Hirshfeld  
*Performing the Functions and Duties of the*  
*Under Secretary of Commerce for Intellectual Property and*  
*Director of the United States Patent and Trademark Office*